United States Patent
Bautista et al.

[19]

[11] Patent Number: 6,157,235

[45] Date of Patent: Dec. 5, 2000

[54] QUADRATURE SIGNAL GENERATOR AND METHOD THEREFOR

[75] Inventors: Edwin E. Bautista, Hollywood; Babak Bastani, Weston, both of Fla.

[73] Assignee: Motorola, Inc., Schaumburg, Ill.

[21] Appl. No.: 09/324,598

[22] Filed: Jun. 1, 1999

[51] Int. Cl.[7] .............................. H03H 11/16; H03K 3/00
[52] U.S. Cl. ............................................................ 327/254
[58] Field of Search ................................. 327/233–239, 327/244, 245, 254–259, 141, 147, 150, 156, 159, 163

[56] References Cited

U.S. PATENT DOCUMENTS

| | | | |
|---|---|---|---|
| 3,757,214 | 9/1973 | Kaufman | 324/83 Q |
| 4,682,117 | 7/1987 | Gibson | 329/50 |
| 4,696,017 | 9/1987 | Masheff et al. | 375/60 |
| 4,908,532 | 3/1990 | Chadwick | 327/236 |
| 5,109,392 | 4/1992 | McDonald | 375/85 |
| 5,847,619 | 12/1998 | Kirisawa | 332/103 |

*Primary Examiner*—My-Trang Nuton
*Attorney, Agent, or Firm*—Andrew S. Fuller

[57] ABSTRACT

A quadrature generator (100) includes a phase detector (125) having a set of differential inputs for coupling in-phase and quadrature signals (114,116) and a set of differential outputs for providing a phase error signal (135). Switches (122,127) are associated with the set of input terminals and with the set of output terminals. The switches (122,127) are synchronously controlled to switch around the signals at the input terminals and at the output terminals in concert, and in rapid succession. The operation of the switches (122,127) eliminates or reduces the effects of imperfections within the parallel paths of the phase detector circuitry (125), in order to produce a more accurate phase deviation signal.

11 Claims, 2 Drawing Sheets

QUADRATURE SIGNAL GENERATOR AND METHOD THEREFOR

TECHNICAL FIELD

This invention relates in general to user input devices, and more particularly, to keypad or button based input devices.

BACKGROUND OF THE INVENTION

Certain radio frequency (RF) applications perform signal processing operations by separating radio frequency signals into signal components representing in-phase and quadrature channels (I and Q channels). Generally, such applications contain circuitry, such as a quadrature signal generator, for producing the in-phase and quadrature signal components with a phase separation of ninety degrees. One example of a prior art quadrature signal generator is described in U.S. Pat. No. 4,908,532 issued to Chadwick on Mar. 13, 1990. Here, a phase shifting network generates signals with a ninety degree phase difference. A phase detector supplements the phase shifting network by detecting deviations from the desired 90 degree separation, and by producing a control signal to restore and maintain the 90 degree phase difference.

The accuracy of quadrature signal generators depends on the design, and on the quality of the manufacturing process and of the components used in the attendant circuitry. Variances in the manufacturing process and in component quality may lead to degradation in circuit performance. For example, the effectiveness of the corrective action performed by the phase detector described in Chadwick depends on the ability of the phase detector to correctly determine phase deviations. The phase detector may suffer from imperfections in its circuitry and thus be unable to render proper phase detection for precise signal generation. Precise generation of in-phase and quadrature signal components is desirable in many applications. Thus, a solution needed that is less susceptible to manufacturing imperfections, and that is more likely to produce precise signals.

DETAILED DESCRIPTION OF THE PREFERRED EMBODIMENT

Figure 1:
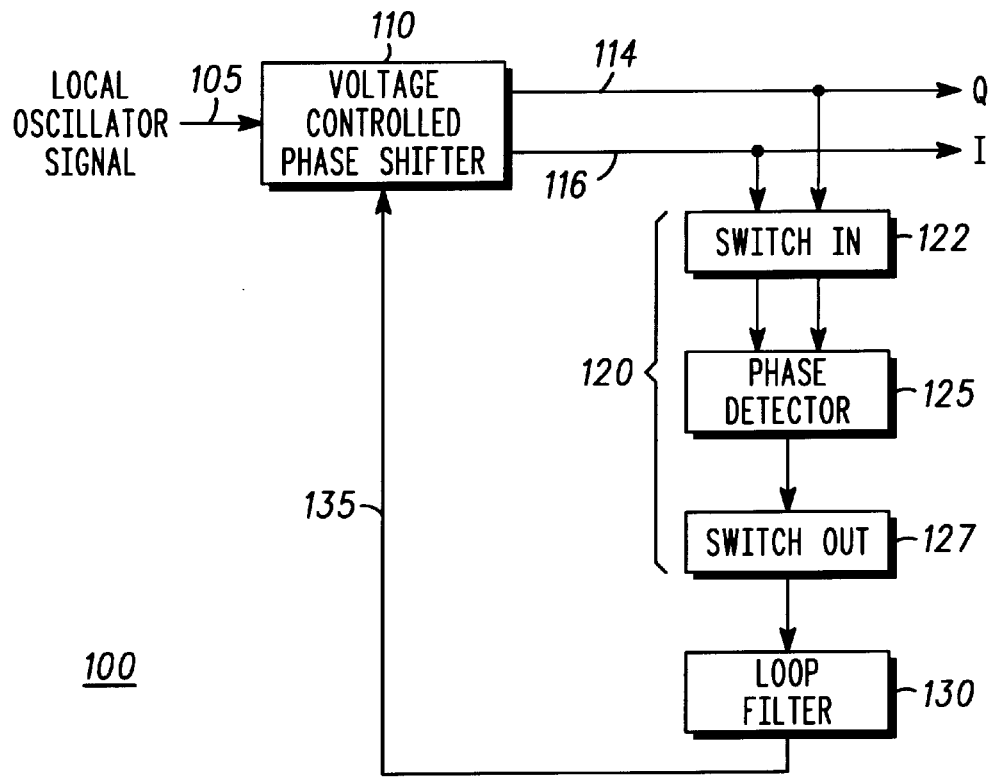
FIG. 1 is a block diagram of a quadrature signal generator, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a quadrature generator that includes a phase detector having a set of differential input terminals for coupling in-phase and quadrature signals and a set of differential output terminals for providing a phase error signal. Switches are associated with the set of input terminals and with the set of output terminals. The switches are synchronously controlled to switch around the signals at the input terminals and at the output terminals in concert, and in rapid succession. The operation of the switches eliminates or reduces the effects of imperfections within the parallel paths of the phase detector circuitry, in order to produce a more accurate phase deviation signal.

FIG. 1 shows a block diagram of a quadrature signal generator 100, in accordance of the present invention. A local oscillator signal 105 is provided to a voltage controlled phase shifter 110. The phase shifter 110 is preferably a phase locking quadrature signal splitter that generates in-phase and quadrature output signals 114, 116 intended to be 90 degrees out of phase with respect to each other. The in-phase and quadrature signals 114, 116 are coupled into a phase detector system 120, which includes phase detection circuitry 125 and input and output switches or switching arrangements 122, 127. The phase detector system 120 generates a control signal that reflects deviations of the in-phase and quadrature signals from the ideal 90 degrees phase difference. The output from the phase detector system 120 is coupled through an output switch 127 to a loop filter 130. The loop filter 130 conditions the control signal 135 for the voltage controlled phase shifter. Thus, a negative feedback loop is formed by the phase detector system 120, the loop filter 130, and the voltage controlled phase shifter 110. The feedback loop operates to force the in-phase and quadrature signals to be precisely 90 degrees out of phase.

Figure 2:
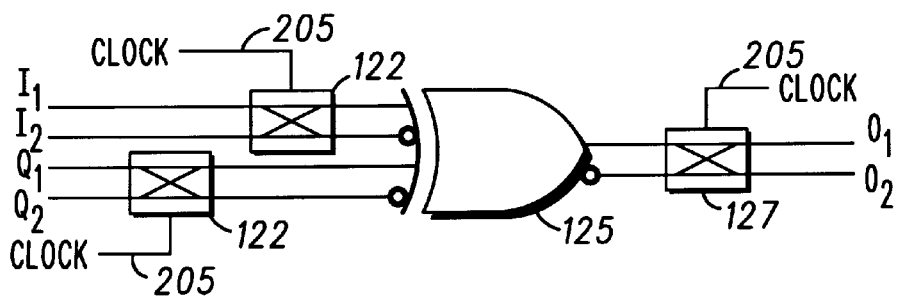
FIG. 2 is a first embodiment of a phase detector and dynamic matching switching arrangement, in accordance with the present invention.
Figure 3:
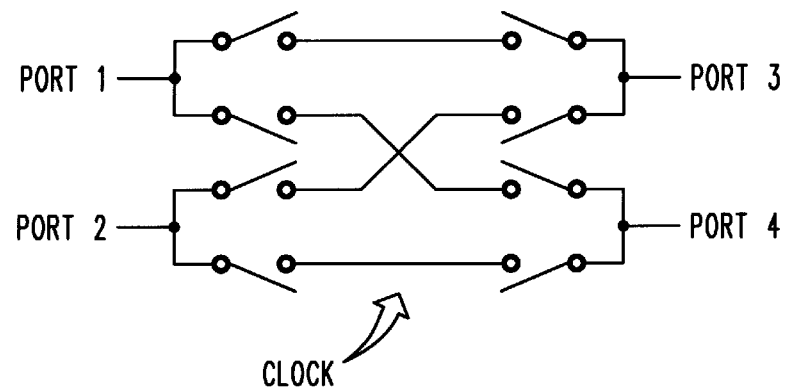
FIG. 3 is a diagram highlighting operation of a dynamic matching switching apparatus, in accordance with the present invention.

FIG. 2 is a circuit diagram highlighting significant features of the phase detection arrangement 120, in accordance with the present invention. A current-mode logic exclusive-OR (CML XOR) gate 125 provides the basic functionality of phase detection in a manner well known in the art. The differential signal lines $I_1$, $I_2$ representing the in-phase signal, and the differential signal lines $Q_1$, $Q_2$ representing the quadrature signal, are coupled to switches 122 at the input of the phase detector 120. Signals from the phase detector 125 are routed through a switch 127 and are outputted on differential output signal lines $O_1$, $O_2$. The switches 122, 127 function in a complementary fashion, and synchronously operate in response to a clock signal 205 or other trigger signal to rapidly switch between alternative or parallel signal paths within the phase detection circuitry. This rapid interchange of signals between parallel signal paths is also referred to as dynamic matching. A more detailed representation of this type of switch is shown in FIG. 3. Here, the switches act in concert to interconnect Port 1 to Port 3 and Port 2 to Port 4, or in the alternative, interconnect Port 1 to Port 4 and Port 2 to Port 3. The switches 122, 127 are constructed to operate in a similar manner. Here, the clock signal line provides a rapid periodic or pseudo-random signal to trigger the switches.

The concerted action of the switches 122, 127 operates to rotate, in a periodic or otherwise frequent manner, the differential half-mode circuits of the CML XOR gate. As a result of this rotation, the direct current offset voltage is modulated up in frequency, where it becomes negligible, or where it can be heavily attenuated with filtering, depending on the rate of rotation. The switching operation reduces or eliminates the effects of induced input referred direct current offsets due to mismatches associated with transistor devices and load resistors typically used to construct CML XOR gates.

Figure 4:
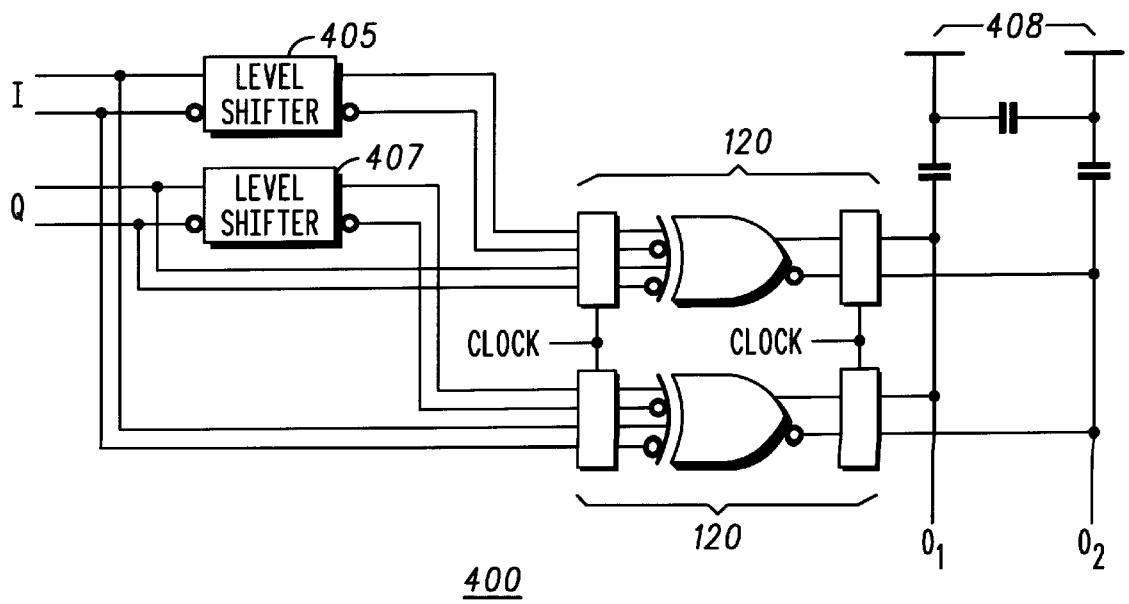
FIG. 4 is a second embodiment of a phase detector and dynamic matching switching arrangement, in accordance with the present invention.

FIG. 4 illustrates a phase detector 400 that operates to minimize time delays associated with unequalled path lengths, within the detection circuitry, between the in-phase and quadrature signal paths. The phase detector 400 includes two level shifters 405, 407 for conditioning the in-phase and quadrature signals to ensure appropriate signal levels. The in-phase and quadrature signals are fed into the different signal paths of identical phase detectors 120 for the purpose of averaging the time delays associated with each signal path. The phase detectors 120 are formed as described with respect to FIG. 2, including phase detection circuitry with switching networks that act in concert on its input and output signals. A capacitive network 408 performs combining and filtering functions and provides for output signals, $O_1$, $O_2$. This phase detector topology minimizes time delays between components of the input signals, and thus greatly improves phase resolution.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A quadrature signal generator, comprising:

phase detection circuitry having a set of input terminals for coupling in-phase (I) and quadrature (Q) signals, and a set of output terminals for providing a phase error signal; and first and second switching arrangements associated with the set of input terminals, and with the set of output terminals, respectively, the first and second switching arrangements being responsive to a control signal to synchronously switch signals at the set of input terminals and at the set of output terminals.

2. The quadrature signal generator of claim 1, further comprising:

a phase shifter having an input coupled to an oscillator signal and an output coupled to the set of input terminals; and a filter having an input coupled to the set of output terminals of the phase detection circuitry and having an output coupled to the phase shifter and providing a control signal therefor.

3. The quadrature signal generator of claim 1, wherein:

the set of input terminals comprises first and second in-phase differential signal lines, and first and second quadrature differential signal lines, and the first switching arrangement operates to switch the first and second in-phase differential signal lines, and to switch the first and second quadrature differential signal lines.

4. The quadrature signal generator of claim 1, wherein:

the set of output terminals comprises a set of differential signal lines and the second switching arrangement operates to switch the set of differential signal lines.

5. The quadrature signal generator of claim 1, wherein the phase detection circuitry comprises first and second identical phase detectors, wherein the in-phase and quadrature signals are applied to different signal paths of the identical phase detectors to average time delays associated with each signal path.

6. A quadrature signal generator, comprising:

phase detection circuitry having a set of differential inputs for coupling in-phase (I) and quadrature (Q) signals, and a set of differential outputs for providing a phase error signal; and first and second switching apparatus associated with the set of differential inputs, and with the set of differential outputs, respectively, the first and second switching apparatus being responsive to a control signal to switch signals at the set of differential inputs and at the set of differential outputs, in concert, to reduce phase detection errors due to mismatches within the phase detection circuitry.

7. The quadrature signal generator of claim 6, further comprising a clock signal line coupled to the first and second switching apparatus to provide the control signal.

8. The quadrature signal generator of claim 7, wherein the phase detection circuitry comprises first and second identical phase detectors, wherein the in-phase and quadrature signals are applied to different signal paths of the identical phase detectors to average time delays associated with each signal path.

9. A method, comprising the steps of:

routing at least in-phase and quadrature signals through parallel input signal paths within phase detection circuitry to determine phase difference between the at least in-phase and quadrature signals; and rapidly interchanging the parallel for in-phase and quadrature signal paths with first and second switching apparatus within the phase detection circuitry to switch said signals between a set of parallel output signal paths, to reduce phase detection errors due to imperfections within the phase detection circuitry.

10. The method of claim 9, further comprising the step of triggering a rapid interchange of parallel signal paths based on a periodic clock signal.

11. The method of claim 9, further comprising the step of triggering a rapid interchange of parallel signal paths based on a pseudo-random signal.

* * * * *